(12) United States Patent
Leyderman

(10) Patent No.: US 6,198,530 B1
(45) Date of Patent: Mar. 6, 2001

(54) ORGANIC CRYSTALLINE FILMS FOR OPTICAL APPLICATIONS AND RELATED METHODS OF FABRICATION

(75) Inventor: Alexander Leyderman, Mayaguez, PR (US)

(73) Assignee: University of Puerto Rico, San Juan, PR (US)

(*) Notice: Subject to any disclaimer, the term of this patent is extended or adjusted under 35 U.S.C. 154(b) by 0 days.

(21) Appl. No.: 09/033,315

(22) Filed: Mar. 2, 1998

Related U.S. Application Data

(62) Division of application No. 08/525,852, filed on Sep. 8, 1995, now Pat. No. 5,746,823.

(51) Int. Cl.$^7$ .......................... G01N 21/01; C30B 29/54
(52) U.S. Cl. ........................ 356/244; 356/36; 117/5; 117/4; 117/7; 117/9; 117/11
(58) Field of Search ................... 356/30, 31, 36, 356/37, 38, 244, 246, 440; 117/58, 64, 67, 73, 934, 938, 939, 4, 5, 7, 9, 11

(56) References Cited

U.S. PATENT DOCUMENTS

| | | |
|---|---|---|
| 3,883,221 | 5/1975 | Rigrod . |
| 3,941,482 | * 3/1976 | Schneider ............................... 356/30 |
| 4,046,618 | 9/1977 | Chaudhari et al. . |

(List continued on next page.)

FOREIGN PATENT DOCUMENTS

406109430 * 4/1994 (JP) ....................................... 356/30

OTHER PUBLICATIONS

Kovrigin et al, Monitoring the Optical Properties of Nonlinear Crystals, Inserum & Exp. Tech, vol. 14, No. 2, pp. 572–574, Mar. 1971.*

K.D. Singer et al., "Measurements of Molecular Second Order Optical Susceptibilities Using dc Induced Second Harmonic Generation", *J. Chem. Phys.*, vol. 75, No. 7, Oct. 1, 1981, pp. 3572–3580.

K. M. M. Kruse, "Apparatus and Method for the Growing of Single Crystal Specimens of Organic Substances for Infrared Spectroscopic Investigation", *Journal of Physics E: Scientific Instruments*, vol. 3, 1970, pp. 609–614.

S. Pech et al., "A New Technique for Determining the Kinetics of Crystal Growth from the Melt", *Journal of Crystal Growth*, vol. 43, No. 1, Jan.–Feb. 1978, pp. 123–125.

S. K. Kurtz et al., "A Powder Technique for the Evaluation of Nonlinear Optical Materials", *Journal of Applied Physics*, vol. 39, No. 8, Jul. 6, 1968, pp. 3798–3813.

D. Stockbarger, "The Production of Large Single Crystals of Lithium Fluoride", *The Review of Scientific Instruments*, vol. 7, 1936, pp. 133–136.

P. W. Bridgman, "Certain Physical Properties of Single Crystals of Tungsten, Antimony, Bismuth, Tellurium, Cadmium, Zinc, and Tin", *Proc. Amer. Acad.*, vol. 60, 1925, pp. 303–383.

Primary Examiner—Hoa Q. Pham
(74) Attorney, Agent, or Firm—Patent Law Offices of Heath W. Hoglund

(57) ABSTRACT

A method for forming an optical device includes the steps of providing a first plate having a first face defining a recess, filling the recess with a material which can be crystallized, and covering the first face and the recess with a second plate having a second face, so that the second face is in contact with the first face and the material in the recess is completely enclosed by the first and second plates. The material in the recess is thereby protected from chemical and mechanical damage, as well as evaporation. In addition, the plates can be transparent, allowing the material in the recess to be visually monitored. A grown crystalline film packed in the cell can be used as a non-liner and/or electro-optical device.

23 Claims, 13 Drawing Sheets

U.S. PATENT DOCUMENTS

| | | |
|---|---|---|
| 4,084,985 | 4/1978 | Evans, Jr. . |
| 4,227,961 | 10/1980 | Takagi . |
| 4,419,810 | 12/1983 | Riseman . |
| 4,684,434 | 8/1987 | Thakur et al. . |
| 4,776,917 * | 10/1988 | Ogibara et al. ................ 356/30 |
| 4,793,893 | 12/1988 | Thakur et al. . |
| 4,847,053 | 7/1989 | Pastor et al. . |
| 4,980,551 * | 12/1990 | Wong ................................. 356/244 |
| 5,173,446 | 12/1992 | Asakawa et al. . |
| 5,363,797 | 11/1994 | Uenishi et al. . |
| 5,385,116 | 1/1995 | Hattori et al. . |
| 5,746,823 * | 5/1998 | Leyderman ........................ 117/5 |

\* cited by examiner

Intensity of the second harmonic (SH) versus azimuthal ($\phi$, triangles) and tilting ($\theta$, circles) rotation angles. Crystal thickness is 1 μ m. E is perpendicular to n.. $\phi_{max}$ =70°, $\theta_{max}$ =5°

Intensity of the second harmonic (SH) versus azimuthal ($\phi$, triangles) and tilting ($\theta$, circles) rotation angles. Crystal thickness is 1 μ m. E is parallel to $n_1$. $\phi$ max =71°, $\theta$ max =6°

Intensity of the second harmonic (SH) versus azimuthal ($\phi$, triangles) and tilting ($\theta$, circles) rotation angles. Crystal thickness is 2 μm. E is perpendicular to n,. $\phi_{max}$ =11°, $\theta_{max}$ =38°

Intensity of the second harmonic (SH) versus azimuthal ($\phi$, triangles) and tilting ($\theta$, circles) rotation angles. Crystal thickness is 2 μm. E is parallel to $n_r$. $\phi_{max} = 13°$, $\theta_{max} = 52°$ Intensity of the second harmonic (SH) versus azimuthal ($\phi$, triangles) and tilting ($\theta$, circles) rotation angles. Crystal thickness is 5 μm. E is perpendicular to $n_+$. $\phi_{max} = 66°$, $\theta_{max} = 20°$ Intensity of the second harmonic (SH) versus azimuthal ($\phi$, triangles) and tilting ($\theta$, circles) rotation angles. Crystal thickness is 5 μm. E is parallel to $n_r$. $\phi_{max} = 71°$, $\theta_{max} = 5°$ m-NA Intensity of the second harmonic (SH) versus azimuthal ($\phi$, triangles) and tilting ($\theta$, circles) rotation angles. Crystal thickness is 10 μm. E is perpendicular to $n_,$. $\phi_{max}$ =9°, $\theta_{max}$ =61° m-NA

Intensity of the second harmonic (SH) versus azimuthal ($\phi$, triangles) and tilting ($\theta$, circles) rotation angles. Crystal thickness is 10 μm. E is parallel to $n_r$. $\phi$ max =19°, $\theta$ max =40°

ORGANIC CRYSTALLINE FILMS FOR OPTICAL APPLICATIONS AND RELATED METHODS OF FABRICATION

CROSS-REFERENCE TO RELATED APPLICATIONS

This application is a division of U.S. patent application Ser. No. 08/525,852, filed Sep. 8, 1995, now U.S. Pat. No. 5,746,823, issued May 5, 1998.

The present invention was made with U.S. Government support under Grant Number NCC8-37 and Grant Number MAGW-4087 from the national Aeronautics and Space Administration (NASA). The U.S. Government might have certain rights in this invention.

FIELD OF THE INVENTION

The present invention relates to organic films, and more particularly to organic crystalline films.

BACKGROUND OF THE INVENTION

Films of organic crystalline materials can be used in various optical applications. For example, optical waveguides made from organic material include slab waveguides in which light is confined in only one dimension, and 2-D channels of size 1 cm×1 μm×1 μm. In addition, cylindrical geometry devices filled inside and outside by a non-linear material and surrounded by an electrical field have been reported.

The growth of thin single crystals is discussed, for example in the reference by K. M. M. Kruse entitled "Apparatus and Method For The Growing Of Single Crystal Specimens Of Organic Substances For Infrared Spectroscopic Investigation," J. of Physics E. Scientific Instr., vol. 3, pp. 609–14, 1970, Great Britain. The crystals are grown from the melt between NaCl (or KBr) windows held at a distance of about 25 μm apart by means of a thin spacer (Polyester foil). A temperature gradient is maintained first along a capillary and then along the largest dimension on the NaCl windows, resulting in a clear definition of the crystallizing zone. The crystallizing zone is slowly raised by lowering the cell along the vertical temperature gradient within a heated column.

A second reference by Pech et al. studies the growth of solid benzophenone from its own melt contained in a crucible submitted to a unidirectional temperature gradient. Pech et al., "A New Technique For Determining The Kinetics Of Crystal Growth From The Melt," J. of Crystal Growth, vol. 43, no. 1, 123–25, 1978. In this reference, a sample was placed in a 1×10×15 mm$^3$ crucible made of glass plates. Thermal boundary conditions were imposed by two heating blocks fixed to the extremities of the crucible and connected to thermostats. The crucible is fixed to the substage of a microscope so that the moving liquid-solid interface can be maintained in coincidence with the crosshair reticule of the objective of the microscope.

Another method for producing a crystal film is discussed in the Hattori et al. patent entitled "Method For Producing Organic Crystal Film." U.S. Pat. No. 5,385,116. In this patent, a crystal film of an organic compound is produced from a molten liquid between a pair of substrates. At least one of the pair of substrates has on a part of a surface thereof a three-dimensional geometrical structure capable of controlling the direction of crystal growth of the organic compound. The other part of the surface having the three-dimensional geometrical structure is smooth.

U.S. Pat. No. 4,793,893 to Thakur et al. entitled "Methods For The Preparation Of Thin Large-Area Single Crystals Of Diacetylenes And Polydiacetylenes" discusses a method for preparing thin large-area single crystals of diacetylene monomer. This method involves forming a liquid layer containing pure diacetylene monomer between two opposed surfaces; applying pressure to the liquid layer disposed between the two opposed surfaces; and crystallizing the liquid layer disposed between the two opposed surfaces while by evaporation the liquid layer is kept under constant pressure to form a thin large-area single crystal of pure diacetylene monomer. This patent also discusses a method for preparing a thin large-area single crystal of pure diacetylene monomer.

Notwithstanding the above mentioned references, there continues to exist a need in the art for improved structures including organic crystals and related methods for forming organic crystals.

SUMMARY OF THE INVENTION

In view of the foregoing background, it is therefore an object of the present invention to provide improved methods and structures for organic crystalline films.

This and other objects, features and advantages according to the present invention are achieved by providing a first plate having a first face. The first face defines a recess which is filled with a material which can be crystallized, and covered with a second plate having a second face. Accordingly, the second face is in contact with the first face and the material in the recess is completely enclosed by the first and second plates. The material within the recess is thereby protected by the plates from chemical and mechanical damage as well as evaporation.

The material in the recess can be crystallized, and the step of crystallization can include the steps of heating the material above a melting temperature, and cooling the material to obtain a homogeneous distribution. The crystallization step can be used to produce a single crystal film of the material in the recess. The single crystal film can provide optical properties that are superior to those of polycrystalline films. In addition, the material can be an organic compound which has non-linear optical properties.

The plates used to contain the material are preferably transparent allowing the material to be visually monitored during the crystallization step. For example, the plates can be formed of fused quartz, which is preferably optically polished to reduce the formation of defects during the crystallization step.

Furthermore, the first face of the first plate preferably defines a groove surrounding the recess. This groove can then be used to contain a portion of the material. For example, if the recess is initially overfilled, or if the material overflows from the recess as a result of thermal expansion, the excess can be contained by the groove. Accordingly, any excess material will be prevented from separating the two plates.

In another embodiment of the present invention, an optical device includes a first plate having a first face which defines a recess, a crystalline material in the recess, and a second plate having a second face wherein the second face covers the first face and crystalline material in the recess. The first face of the first plate may further define a groove surrounding the recess, and a portion of the crystalline material may be contained in the groove surrounding the recess.

The first and second plates are preferably first and second transparent plates such as first and second fused quartz plates. In addition, the second face of the second plate and a surface of the recess opposite the second plate are preferably optically polished. The crystalline material may be an organic compound, and it is preferably a single crystal film.

The methods and structures of the present invention provide an organic single crystal thin film which can be used in non-linear optical applications. The structure can be reproducibly fabricated with relatively little expense. In addition, the thin film in the recess is protected from chemical and mechanical damage, as well as evaporation, by the two plates.

DETAILED DESCRIPTION OF A PREFERRED EMBODIMENT

Figure 1:
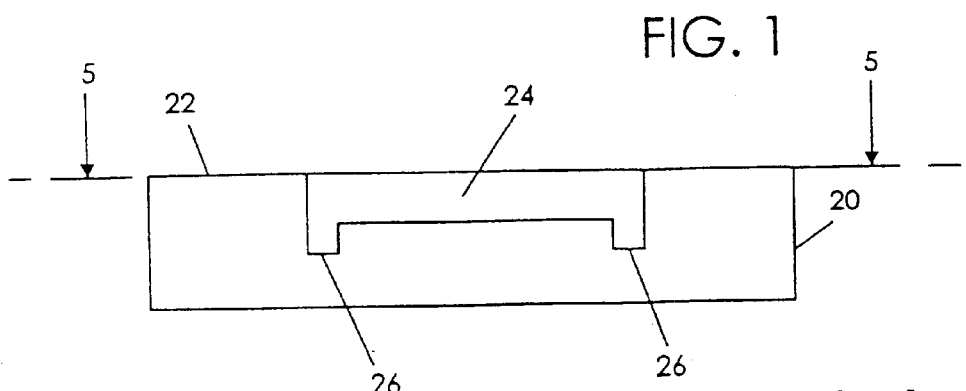
FIGS. 1–4 show cross-sectional views of various steps in the fabrication of a thin crystalline film according to a method of the present invention.

The present invention will now be described more fully hereinafter with reference to the accompanying drawings, in which preferred embodiments of the present invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. In the drawings, the thickness of the layers and regions are exaggerated for clarity. Like numbers refer to like elements throughout and prime notation is used to indicate like elements in various embodiments.

Figure 3:
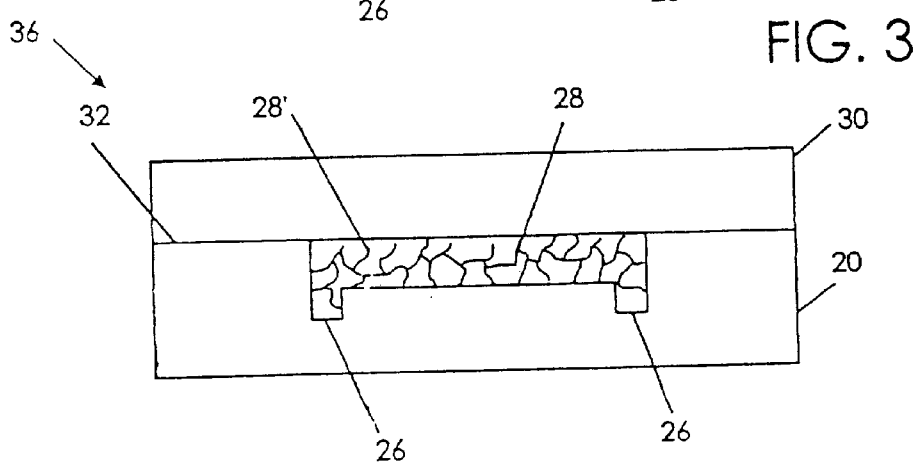
Figure 4:
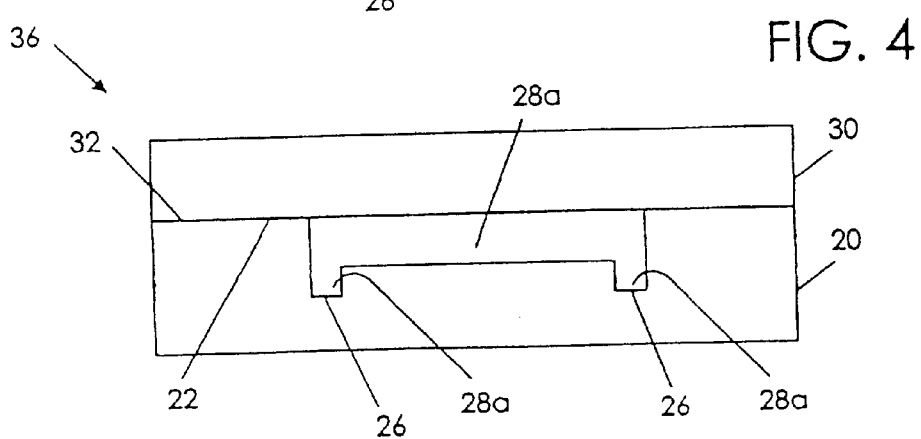
Figure 5:
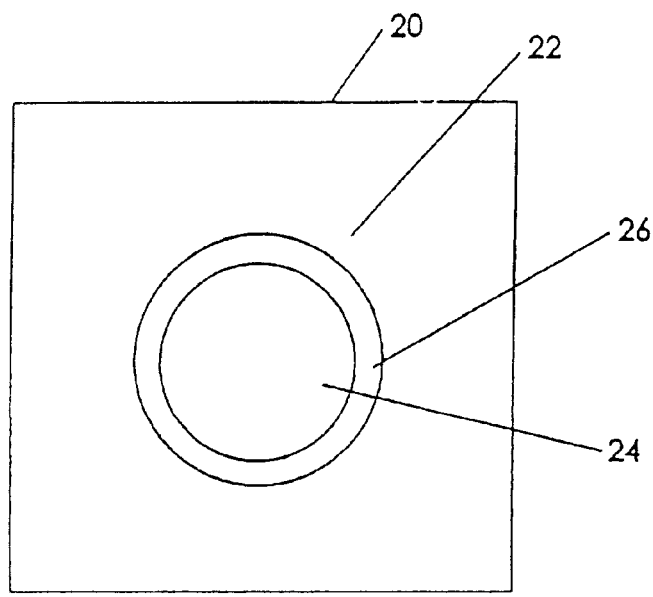
FIG. 5 shows a top view of a plate including a recess and a grove according to FIG. 1.

An organic crystalline film, according to the present invention, can be fabricated by a method illustrated in FIGS. 1–4 and 5. In this method, a thin crystalline film is grown between two plates. As shown in FIGS. 1 and 5, a first plate 20 has a first face 22, and the first face defines a recess 24. The recess 24 can be on the order of 10 mm in diameter, and anywhere from 0.5 to 500 micrometers deep. The first face may also define a groove 26. As shown in FIG. 5, the recess and groove are both circular. As will be understood by those having skill in the art, however, the recess and groove may have other shapes such as oval, oblong, square, etc.

Figure 2:
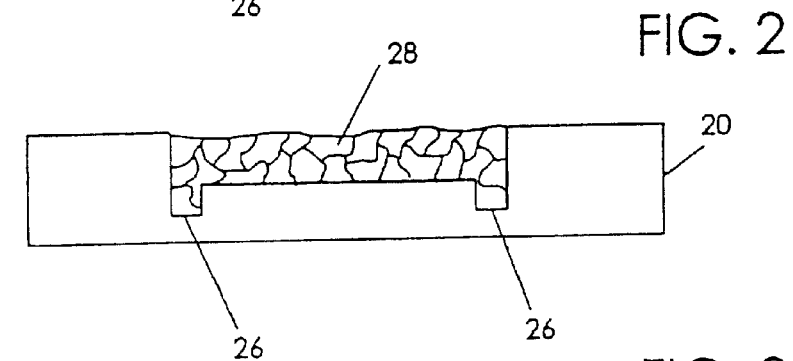

As shown in FIG. 2, the recess is filled with a material 28 such as meta-nitroaniline (m-NA), 2-methyl-4-nitroaniline (MNA), (–)(2-alpha-methylbenzyl-amino)-5-nitropyridine (MBANP), N-(4-nitrophenyl)-(L)-prolinol (NPP), benzyl, or other compounds known to those having skill in the art which can be crystallized by heating the material to obtain a homogenous distribution and then cooling the material. Other organic materials are disclosed for example in the following references: K. M. M. Kruse, "Apparatus and Method for the Growing of Single Crystal Specimens of Organic Substances for Infrared Spectroscopic Investigation," J. of Physics E. Scientific Instr., vol. 3, pp. 609–14, 1970 (Great Britain); Pech et al., "A New Technique for Determining the Kinetics of Crystal from the Melt," J. of Crystal Growth, vol. 43, no. 1, pp. 123–25, (1978); U.S. Pat. No. 5,385,116 to Hattori et al. entitled "Method for Producing Organic Crystal Film"; and U.S. Pat. No. 4,793,893 to Thakur et al. entitled "Methods for the Preparation of Thin Large-Area Single Crystals of Polydiacetylenes." Each of these references is hereby incorporated herein in its entirety by reference.

The first face 22 of the first plate 20 and the recess 24 are then covered by a second plate 30 so that the second face 32 of the second plate 30 is in contact with the first face 22 of the first plate 22. Accordingly, the second plate 30 acts as a lid, enclosing the material 28 within the recess 24 as shown in FIG. 3. The material 28 is preferably a thin polycrystalline film at this point. The material can be heated above its melting point and then cooled in order to form a thin polycrystalline film with a homogeneous distribution. As shown, this film may contain a plurality of crystal grains, including the single crystal grain 28', divided by grain boundaries.

The plates are both preferably transparent, so that the material 28 can be visually monitored during the various steps of the fabrication of the single crystal film. For example, the two plates can be fused quartz plates. In addition, the plates are optically polished allowing the two plates to fit closely together and also to avoid the formation of seeds during the crystallization step.

The material is then crystallized to from a single crystal thin film 28a of the material which is completely enclosed within in the recess 24 between the two plates, as shown in FIG. 4. The material 28 can be crystallized by heating above the melting point of the material (112 degrees C. for m-NA) and then slowly cooling the material sot hat a single crystal film forms from a single crystal grain. For example, the material 28 can be completely melted except for the single crystal grain 28'. When the material is slowly cooled, a single crystal thin film 28a grows from the single crystal grain 28'.

The groove 26 surrounding the recess 24 can be used to contain an excess portion 28b of the material which overflows from the recess 24. For example, the overflow may be caused by initially overfilling the recess or as a result of heating the material thereby resulting in thermal expansion of the material. By providing a groove 26 where excess portions 28b of the material can accumulate, the excess material is prevented from remaining between the faces of the two plates. Accordingly, the two plates can be maintained in direct contact without being separated by excess portions of the material. The faces of the two plates form a tight seal protecting the material within the recess from chemical or mechanical damage as well as from evaporation.

Figure 6:
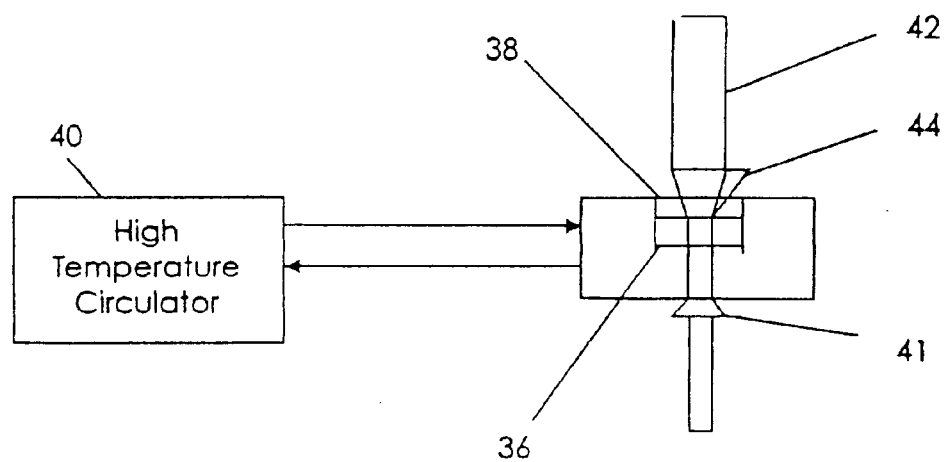
FIG. 6 shows an experimental set up according to the present invention.

The two plate structure of FIGS. 3 and 4 defines a cell 36 which can be incorporated in the experimental setup of FIG. 6. The cell 36 is positioned in a heat exchange chamber 38 in which a desired temperature is achieved by pumping a liquid heat carrier from a high temperature circulator 40 with a temperature controller. The heat exchange chamber can be brass, and the temperature circulator can be a commercially available temperature circulator such as a Neslab EX-250HT high temperature controller. The liquid heat carrier can be distilled water for growing crystals with melting points below 100 degrees C., or a commercially available liquid such as Syntherm 800 liquid having a boiling point higher than that of water for growing crystals with melting points above 100 degrees C. The heat exchange chamber 38 and the cell 36 are placed on the stage 41 of a polarizing microscope 42 for observation and control of single crystal growth. The stage preferably has three degrees of freedom of motion, allowing observation of different regions of the crystal during crystal growth.

In one embodiment of a method according to the present invention, the material in the recess formed by the plates of the cell is heated and then cooled to obtain a homogeneous distribution as shown in FIG. 3. The cell 36 is then placed in the heat exchange chamber 38 as shown in FIG. 6, and a single crystal grain 28' having a desired crystallographic orientation is visually located using the microscope 42. The temperature of the cell 36 is then increased by pumping the liquid heat carrier through the heat exchange chamber 38 in order to melt the material 28. The single crystal grain 28', however, is maintained in its crystalline form by specifically cooling that grain. This localized cooling can be achieved by using a microjet 44 to blow cool air onto the cell 36 at the location of the single crystal grain. The melted material is then slowly cooled so that the single crystal acts as a seed. Accordingly, the material forms a single crystal film having the same crystallographic orientation as the single crystal grain. While the use of a microjet is disclosed as a means for providing as in gel crystal grain as a seed for crystal growth, other techniques for providing a seed will be known to those having skill in the art.

The thus grown crystal is packed between the two plates preventing its evaporation and mechanical damage. In addition, the microscope allows the crystallization method to be performed manually. Alternately, the method can be automated by using a CCD camera and a computer as will be understood by those having skill in the art.

Crystals have developed sliding systems. The highest rate of crystal growth takes place along the highest density of molecular packing (HDMP) in the cleavage plane. In most crystals having symmetries higher than triclinic, the cleavage plane is typically parallel to the crystallographic plane formed by the smallest parameters, and the direction of growth is parallel to the shortest axis of the lattice cell. In the case of m-NA, the cleavage plane will be the (010) plane, and the direction of growth will be the [001] direction.

When the temperature is decreased from near the melting point of the material, to the ambient temperature, the crystal packed in the recess between the two plates of the cell, experiences strain due to the difference in coefficients of temperature expansion of the crystal and the plates. If the crystal has a thickness greater than 3 micrometers, microscopic cracks may form. The direction of these cracks is collinear with the highest density of molecular packing, and the density of the cracks may be correlated with the thickness of the crystal. In some crystals with thicknesses greater than 10 micrometers, an additional system of more fine and less rectilinear cracks may form in the direction perpendicular to the highest density of molecular packing. Crystalline films with a thickness of less than 1 $\mu$m have been found to have no cracks due to the higher withstanding strain.

The material 28 used to form the thin single crystal film 28a can be an organic material such as m-NA. Orthorhombic m-NA[$(NO_2)C_6H_4(NH_2)$] belongs to the space group Pbc2$_1$ (point group mm 2), with Z=4, and lattice parameters a=6.501 Angstroms, b=19.33 Angstroms, and c=5.082 Angstroms. Various properties of m-NA are given below in Table 1.

TABLE 1

| Name (Abbreviation) and Chemical Formula | 3-nitroaniline (m-NA) $O_2NC_6H_4NH_2$ | | |
|---|---|---|---|
| m.p. ° C. | 112 | | |
| Symmetry | Pbc2$_1$, | $C_{2v}^5$ | |
| Parameters of cell, Å | a = 6.501 | b = 19.33 | c = 5.082 |
| Gliding System | (010), | [001] | |
| Refraction indices* | | | |
| 1064 nm | $n_1$ = 1.74 | $n_2$ = 1.71 | $n_3$ = 1.65 |
| 532 nm | $n_1$ = 1.81 | $n_2$ = 1.79 | $n_3$ = 1.72 |

The strongest intermolecular interaction takes place in the (010) plane along the direction of the c-axis. Besides van der Waals interactions, hydrogen bonding (O . . . H—N and N . . . H—N) contributes to the crystal energy. Both types of interactions are responsible for a double-layer structure which is perpendicular to the crystallographic [010] axis. Observations reveal that m-NA is unstable and oxidizes at its melting point. Recrystallization of the m-NA by the methods of the present invention does not significantly shift the edge of absorption. At the first stage of growth from a seed, the crystal had an arrow like shape with a longer side aligned perpendicular to the larger index of refraction in the plane of the crystal refraction index. For the m-NA crystal, this is also the largest refraction index of the crystal.

Figure 7:
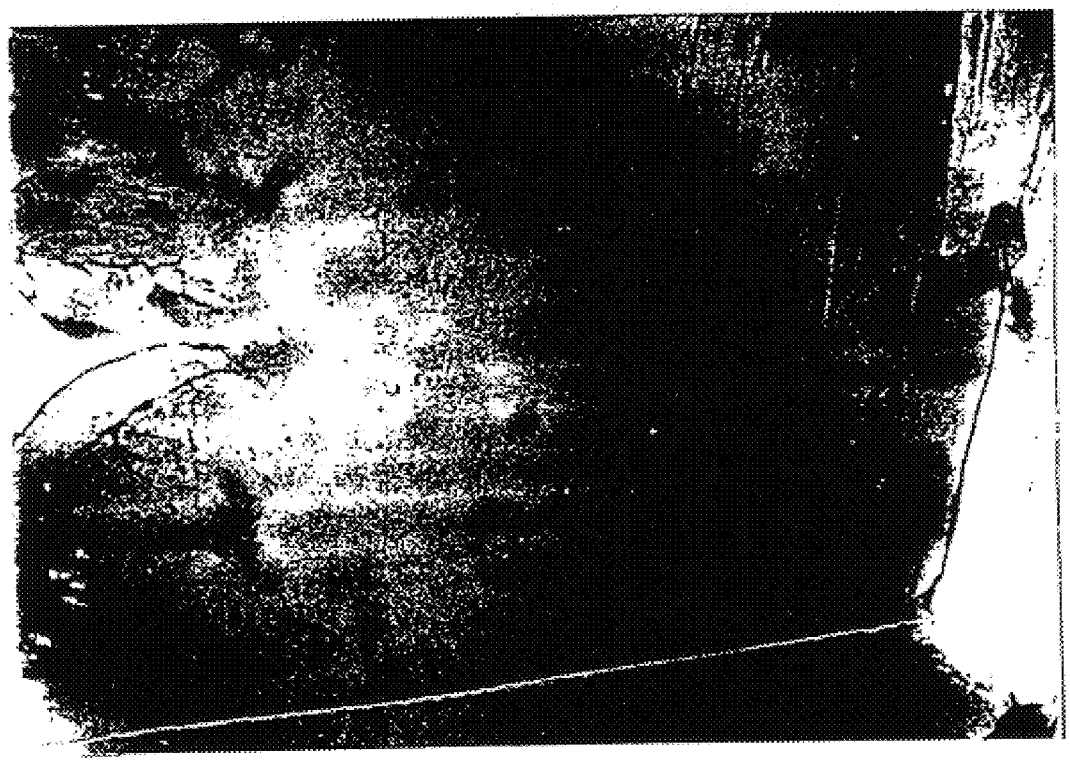
FIG. 7 shows a crystal in polarized light according to the present invention.

By maintaining a single crystal grain of the m-NA as a crystal growth seed by localized cooling, such as by a microjet as discussed above, while melting the rest of the m-NA and then slowly cooling the m-NA, the seed will orient along the temperature gradient. As the crystal seed grows, the formation of spikes of crystal growth, which can result in twin defects, is avoided by slowly lowering the rage of growth while observing the crystal growth. If defects are observed, the temperature can be raised to remelt the defect and then lowered to continue crystal growth. Despite the high asymmetry of growth rates, large-area high quality crystalline films can be grown. FIG. 7 shows a photograph of a m-NA crystalline film in cross-polarized light. This film is about 10 microns thick.

According to various studies, m-NA is a negative biaxial crystal. Refraction indices of m-NA for wavelengths of 1,064 nm and its harmonic 0.532 nm are given in Table 1 above. m-NA belongs to class 13 of Hobden's classification, and phase matching conditions are observed in the cone of directions about the optic axis only for processes involving fundamental waves of parallel polarization (type I).

Figure 8:
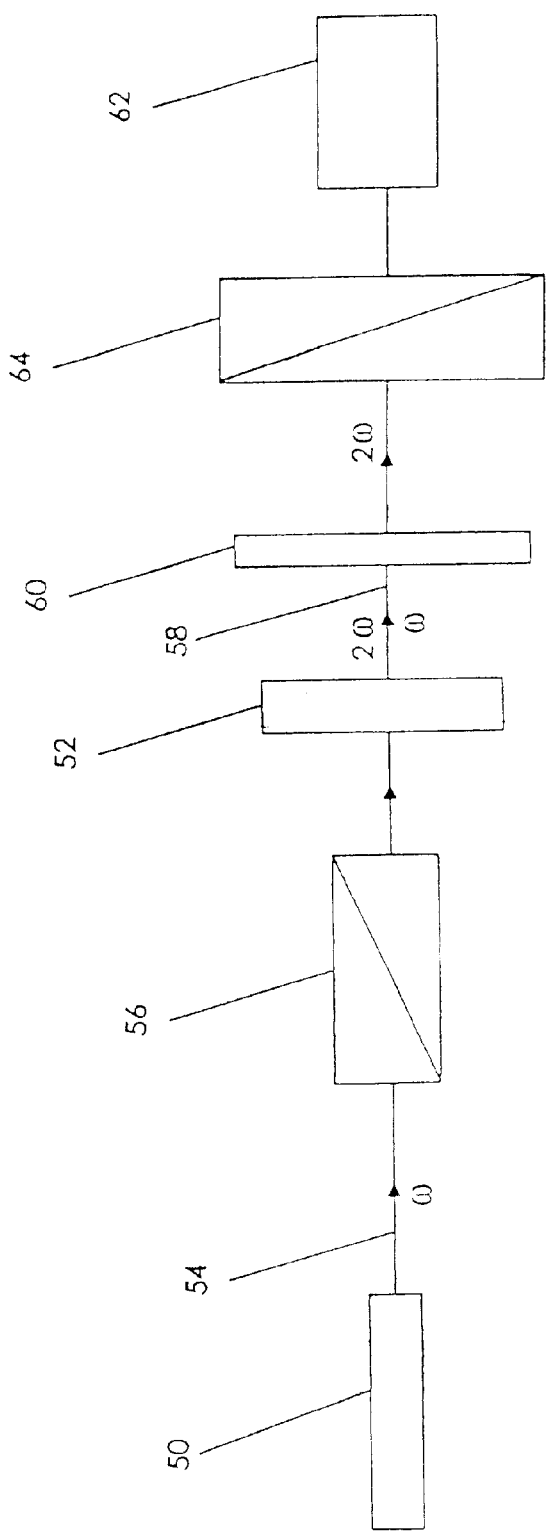
FIG. 8 shows a set up for measuring the second harmonic generation of crystalline films according to the present invention.

FIG. 8 shows a schematic diagram of an experimental setup for second harmonic generation measurements. A 1064 nm wavelength laser 50 such as a Quantel Q-switched Nd:YAG laser (1064 nm) with a 10 HZ pulse repetition rate can be used as a fundamental source. The intensity of the fundamental beam can be on the order of 100 mW/cm$^2$. The crystal 52 can be preliminarily oriented using the polarizing microscope (illustrated in FIG. 6), and placed onto a goniometer head with its plane perpendicular to the incident beam 54. The polarization plane of the incident beam can be rotated by a double-Fresnel rhomb 56, and set either parallel or perpendicular to the c-axis of the crystal 52. The output radiation beam 58 from the crystal can be filtered through filter 6 to eliminate the fundamental 1,064 μm radiation. The generated second harmonic can be detected by a detecting system 62 which may include a lens to focus the second harmonic and a diode detector such as a Hamamatsu S1337-BQ series diode detector. The averaged signal generated by the detecting system 62 can be observed and measured by an oscilloscope such as a Tektronix model 7704 oscilloscope. The experimental setup can also include a polarizer 64 to analyze the generated second harmonic.

A crystal can be initially positioned on the stage of a microscope with the n, axis horizontal, and the $n_\beta$ axis vertical. Rotating the crystal along the vertical axis, the orientation resulting in the maximum intensity of the second harmonic can be found thus defining the direction of matching conditions. The intensity of the second harmonic can be measured versus azimuthal rotation angle (along the $n_\beta$ axis) and tilting angle (around the n, axis).

The intensity of the second harmonic can be determined mathematically by the following equation:

$$I^{2\omega} = \{2\omega^2/[\epsilon_o C^3(n^\omega)^2 n^{2\omega}]\} d^2 L^2 (I^\omega)^2 \text{Sinc}^2(\Delta KL/2)$$

In this equation, L is the thickness of the film, d is the effective non-linear susceptibility, sincc(x)=(sinx)/x, and x=(ΔKL/2) is the phase mismatch between the fundamental and second harmonic waves.

In order to measure the intensity of the second harmonic, the 1064 nm radiation of the laser 50 of FIG. 8 is vertically polarized, and the power of the laser is reduced to a value on the order of 2.5 mW to prevent damage to the crystal. The polarization and intensity of the second harmonic generated by thin crystalline films of m-NA versus the angle of rotation along the vertical and horizontal axes can be measured.

Figure 15:
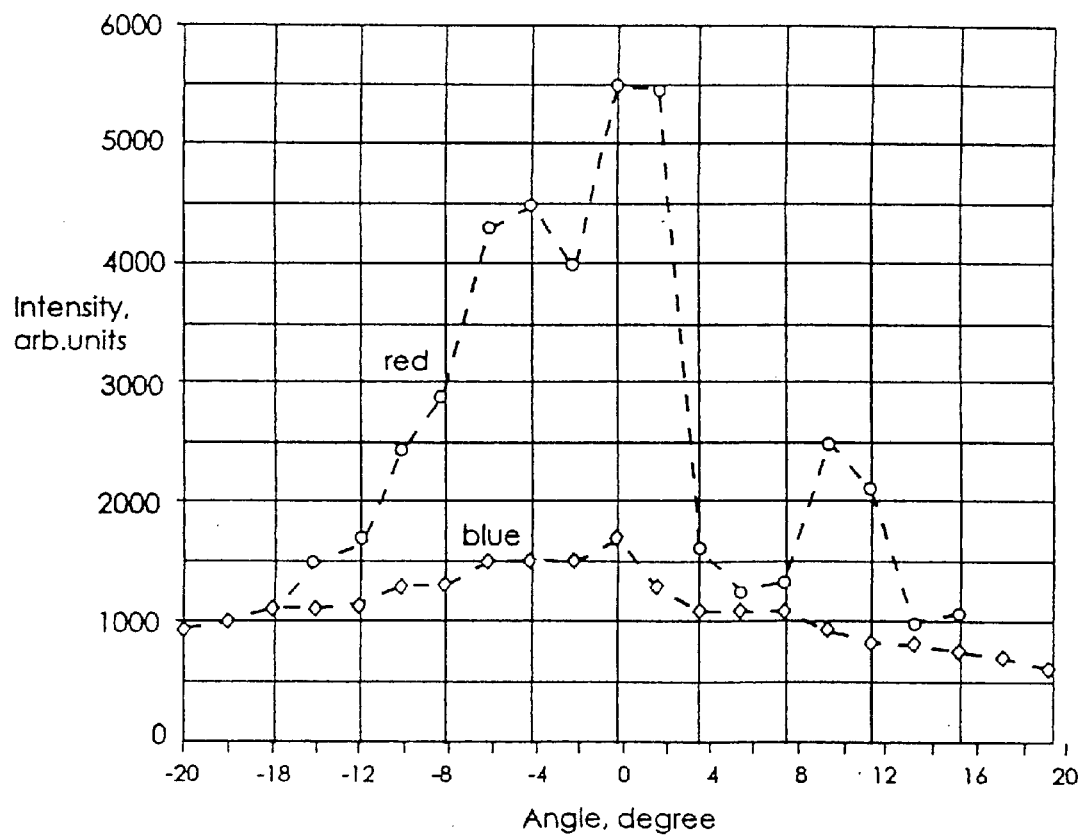
FIG. 15 shows the intensity of the second harmonic versus azimuthal ($\phi$, triangles) and tilting ($\theta$, circles) rotation angles. Crystal thickness is 10 $\mu$m. E is perpendicular to $n_1$. $\phi_{max}=9°$, $\theta_{max}=61°$.
Figure 16:
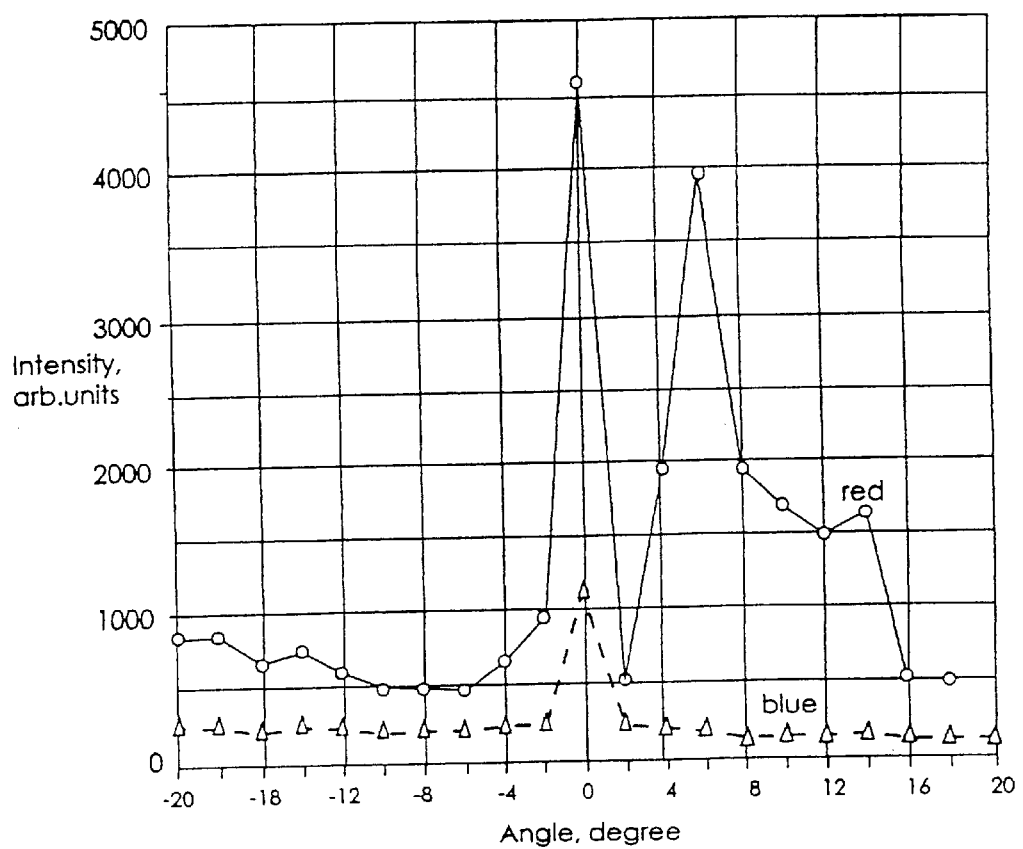
FIG. 16 shows the intensity of the second harmonic versus azimuthal ($\phi$, triangles) and tilting ($\theta$, circles) rotation angles. Crystal thickness is 10 $\mu$m. E is parallel to $n_1$. $\phi_{max}=19°$, $\theta_{max}=40°$.
Figure 17:
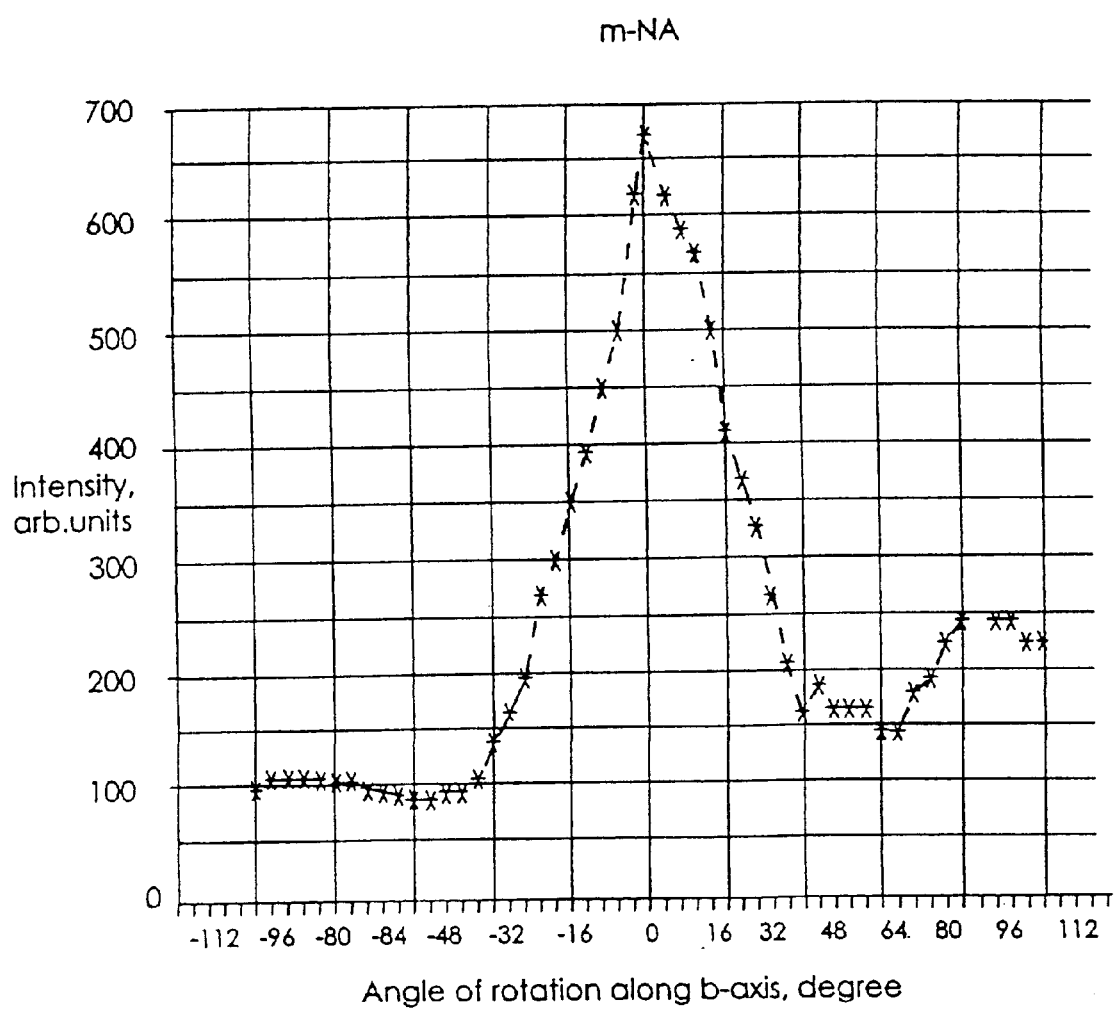
FIG. 17 shows the intensity of the second harmonic versus rotation angle along b-axis (parallel to $n_\alpha$). Crystal thickness=10 $\mu$m.

These measurements were made and the resulting data is graphically illustrated in FIGS. 7–17. In the graphs of FIGS. 9–16, the horizontal axis represents the angle in units of degrees, and the vertical axis represents the intensity of the second harmonic in arbitrary units. In FIG. 17, the horizontal axis represents the angle of rotation along the b-axis in degrees, and the vertical axis represents the intensity of the second harmonic in arbitrary units.

Figure 9:
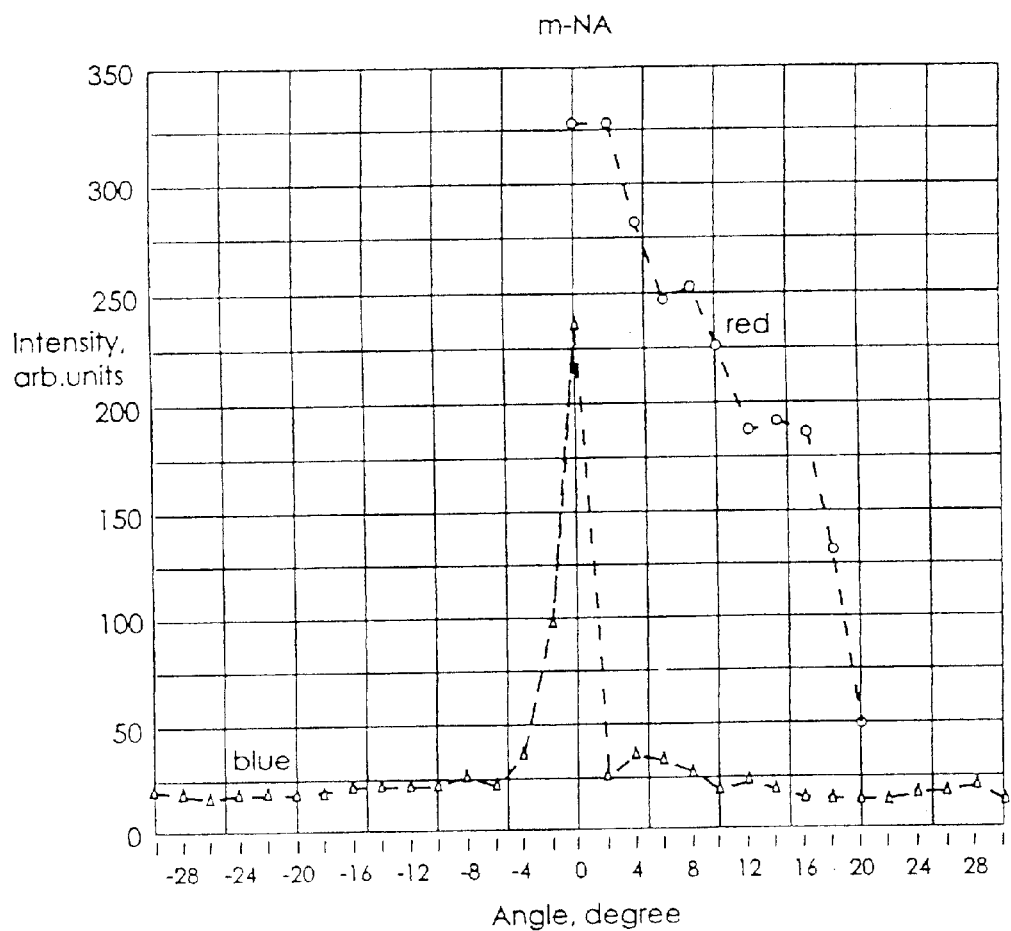
FIG. 9 shows the intensity of the second harmonic versus azimuthal ($\phi$, triangles) and tilting ($\theta$, circles) rotation angles. Crystal thickness is 1 $\mu$m. E is perpendicular to $n_1$. $\phi_{max}=70°$, $\theta_{max}=5°$.
Figure 10:
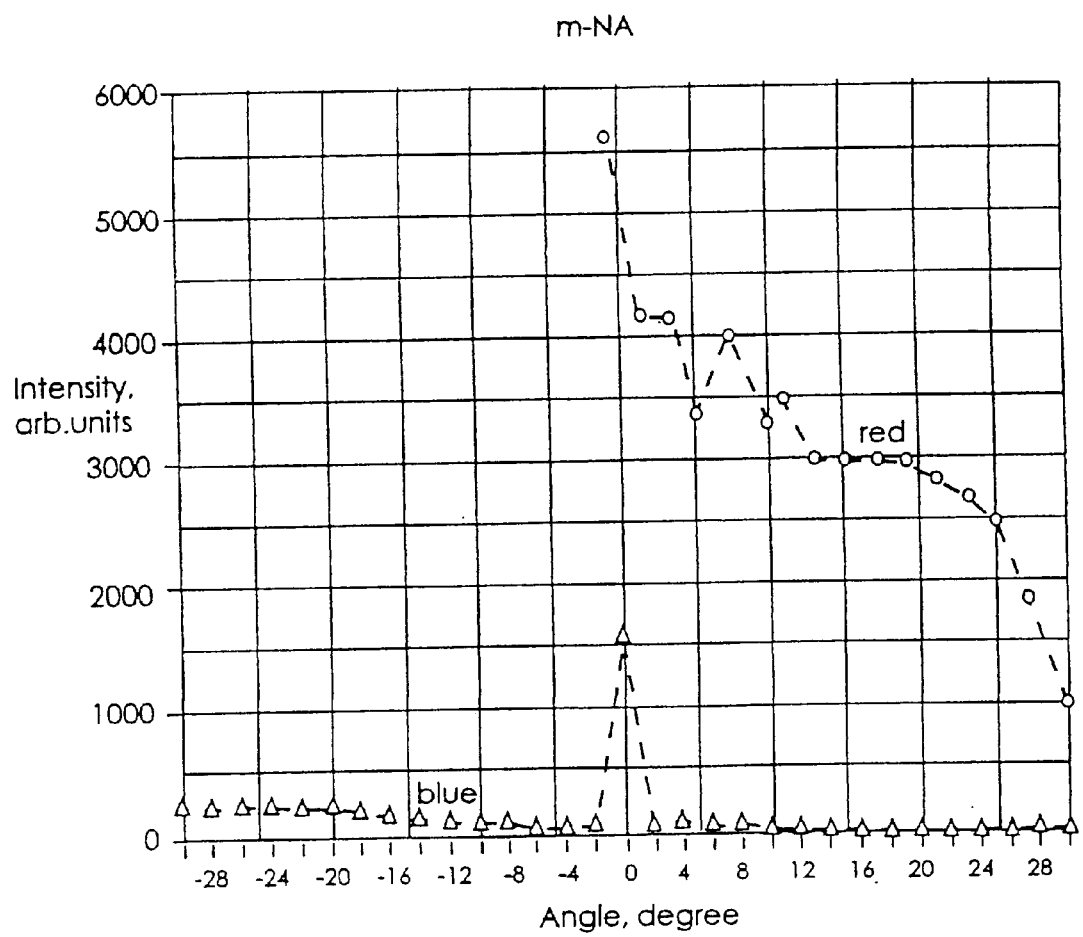
FIG. 10 shows the intensity of the second harmonic versus azimuthal ($\phi$, triangles) and tilting ($\theta$, circles) rotation angles. Crystal thickness is 1 $\mu$m. E is parallel to $n_1$. $\phi_{max}=71°$, $\theta_{max}=6°$.
Figure 11:
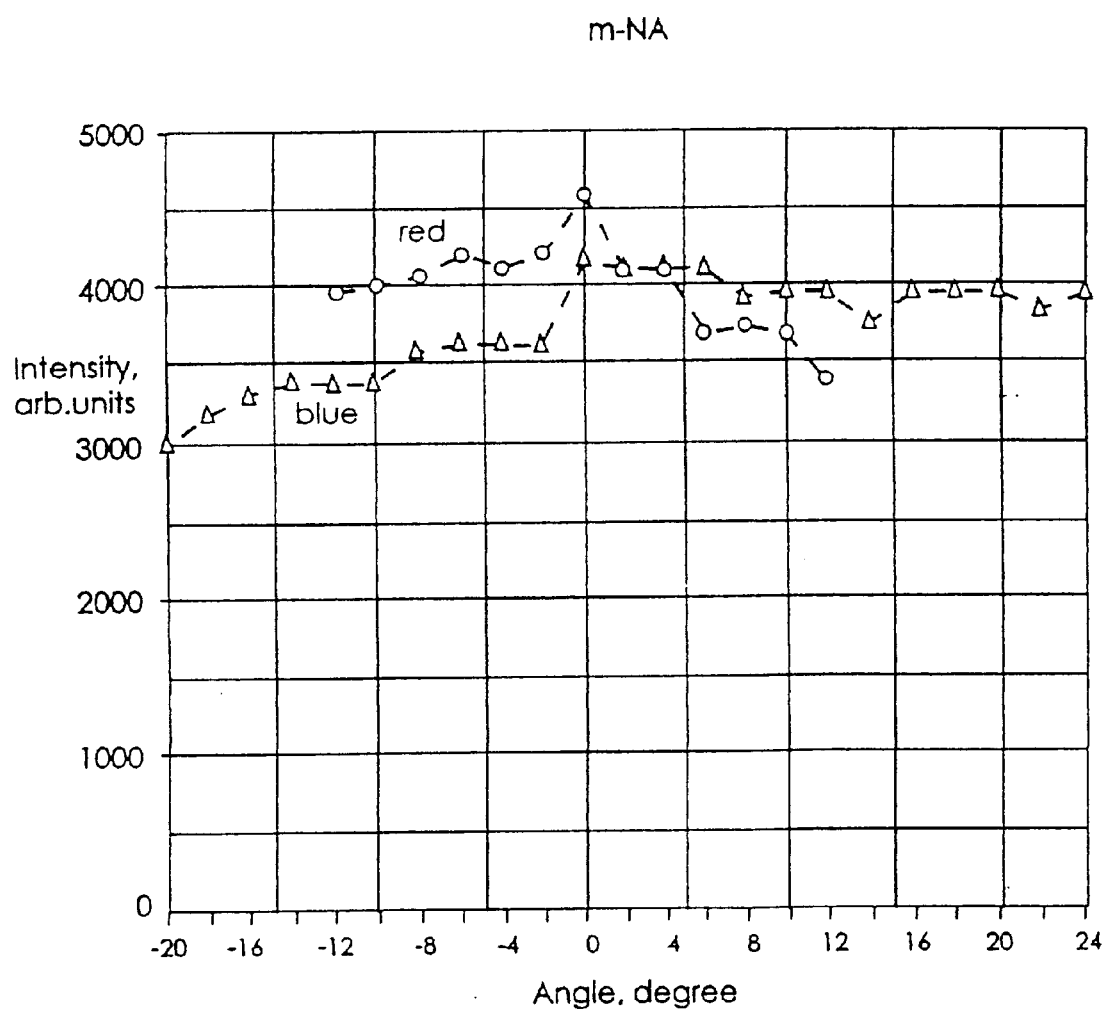
FIG. 11 shows the intensity of the second harmonic versus azimuthal ($\phi$, triangles) and tilting ($\theta$, circles) rotation angles. Crystal thickness is 2 $\mu$m. E is perpendicular to $n_1$. $\phi_{max}=11°$, $\theta_{max}=38°$.
Figure 12:
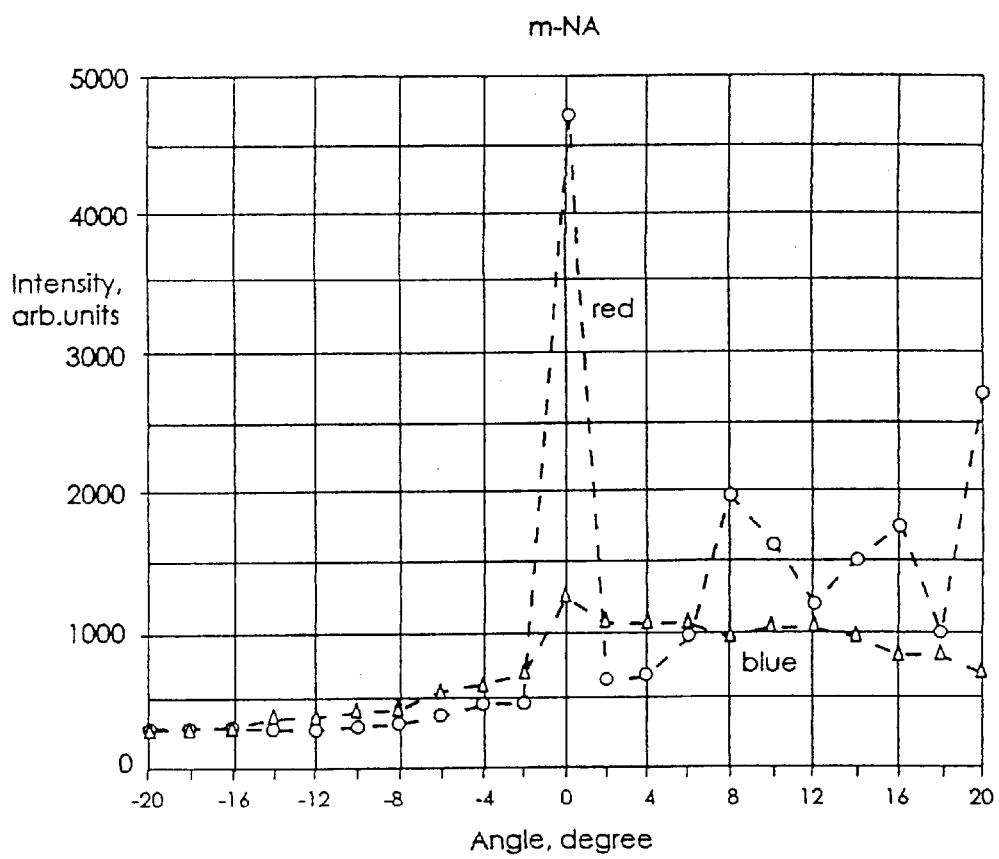
FIG. 12 shows the intensity of the second harmonic versus azimuthal ($\phi$, triangles) and tilting ($\theta$, circles) rotation angles. Crystal thickness is 2 $\mu$m. E is parallel to $n_1$. $\phi_{max}=13°$, $\theta_{max}=52°$.

FIG. 9 shows the intensity of the second harmonic versus azimuthal (φ, triangles) and tilting (θ, circles) rotation angles. The crystal thickness is 1 μm. E is perpendicular to $n_1$, $\phi_{max}$=70°, and $\theta_{max}$=5°. FIG. 10 shows the intensity of the second harmonic versus azimuthal (φ, triangles) and tilting (θ, circles) rotation angles. The crystal thickness is 1 μm. E is parallel to $n_1$, $\phi_{max}$=71°, and $\theta_{max}$=6°. FIG. 11 shows the intensity of the second harmonic versus azimuthal (φ, triangles) and tilting (θ, circles) rotation angles. The crystal thickness is 2 μm. E is perpendicular to $n_1$, $\phi_{max}$=11°, and $\theta_{max}$=38°. FIG. 12 shows the intensity of the second harmonic versus azimuthal (φ, triangles) and tilting (θ, circles) rotation angles. The crystal thickness is 2 μm. E is parallel to $n_1$, $\phi_{max}$=13°, and $\theta_{max}$=52°.

Figure 13:
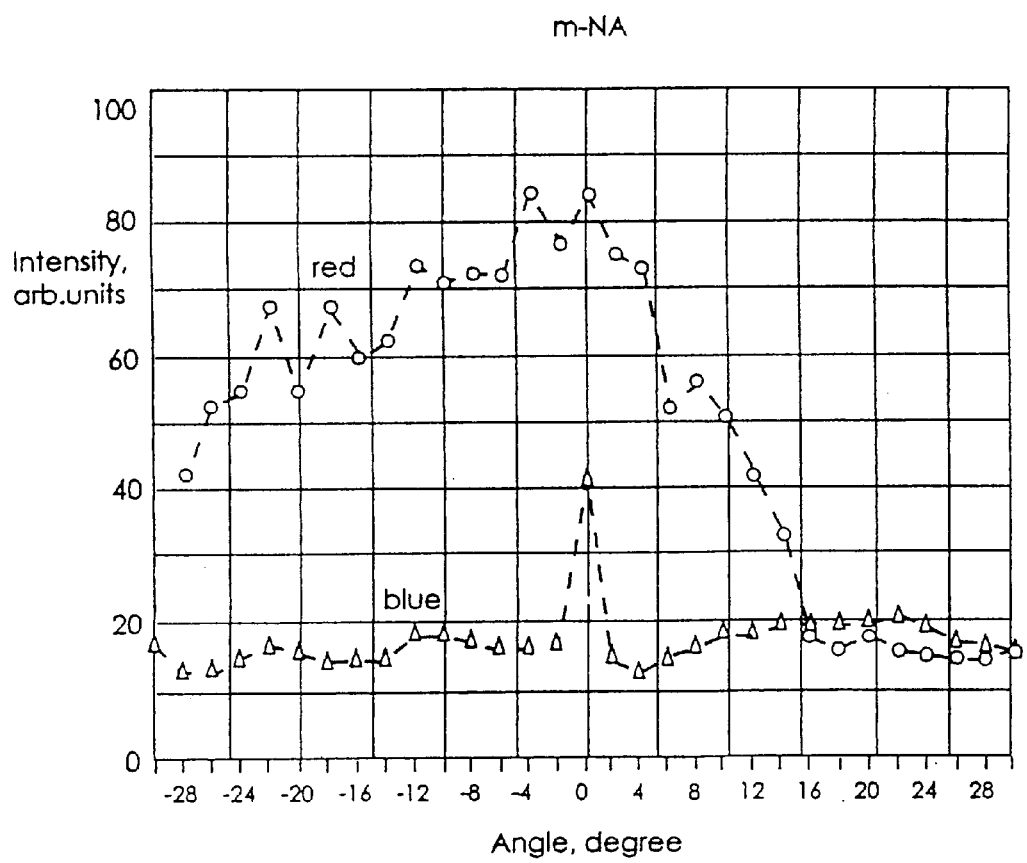
FIG. 13 shows the intensity of the second harmonic versus azimuthal ($\phi$, triangles) and tilting ($\theta$, circles) rotation angles. Crystal thickness is 5 $\mu$m. E is perpendicular to $n_1$. $\phi_{max}=66°$, $\theta_{max}=20°$.
Figure 14:
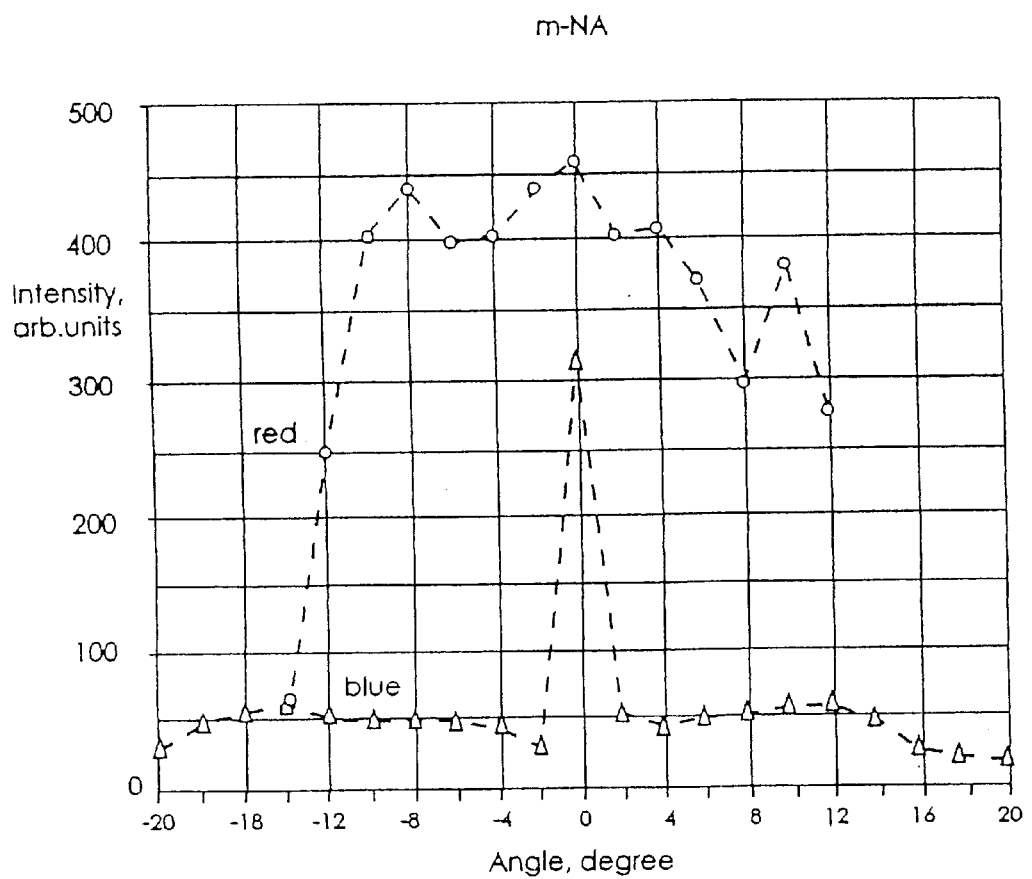
FIG. 14 shows the intensity of the second harmonic versus azimuthal ($\phi$, triangles) and tilting ($\theta$, circles) rotation angles. Crystal thickness is 5 $\mu$m. E is parallel to $n_1$. $\phi_{max}=71°$, $\theta_{max}=5°$.

FIG. 13 shows the intensity of the second harmonic versus azimuthal (φ, triangles) and tilting (θ, circles) rotation angles. The crystal thickness is 5 μm. E is perpendicular to $n_1$, $\phi_{max}$=66°, and $\theta_{max}$=20°. FIG. 14 shows the intensity of the second harmonic versus azimuthal (φ, triangles) and tilting (θ, circles) rotation angles. The crystal thickness is 5 μm. E is parallel to $n_1$, $\phi_{max}$=71°, and $\theta_{max}$=5°. FIG. 15 shows the intensity of the second harmonic versus azimuthal (φ, triangles) and tilting (θ, circles) rotation angles. The crystal thickness is 10 μm. E is perpendicular to $n_1$, $\phi_{max}$=9°, and $\theta_{max}$=61°. FIG. 16 shows the intensity of the second harmonic versus azimuthal (φ, triangles) and tilting (θ, circles) rotation angles. The crystal thickness is 10 μm. E is parallel to $n_1$, $\phi_{max}$=19°, and $\theta_{max}$=40°. FIG. 17 shows the intensity of the second harmonic versus rotation angle along b-axis (parallel to $n_\alpha$). The crystal thickness is 10 μm.

Applicant notices a discrepancy between $\phi_{max}$ and $\theta_{max}$ values for different crystal thicknesses. These values almost coincide for the 1 μm and 5 μm crystal thicknesses, whereas for a thicker 10 μm crystal, the maximum of the second harmonic intensity is achieved along a direction almost in the $n, n_\beta$-plane. Applicant theorizes that for thin crystals (1 μm and 5 μm thick) whose optical path is less than the coherence length (at 1,064 μm varying in the range from $I_{32}$=16 to $I_{33}$=3.9 μm), the mechanism of the second harmonic generation is different from that in thicker crystals. Observations reveal that in thin crystals $\phi_{max}$ and $\theta_{max}$ values correspond to the light propagating in a cone with an angle χ satisfying the Cerenkov condition:

$$\cos \chi = n_{eff}/n_c$$

In this equation, $n_{eff}$ and $n_c$ are the crystal and cell material indices of refraction, respectively. The $\phi_{max}$ and $\theta_{max}$ values for the thick crystal roughly correspond to those estimated for m-NA crystal from the Fresnel equation.

Zero along the horizontal axis indicates the direction along which the maximum of the second harmonic intensity was observed (the matching condition in the $n, n_\alpha$-plane). This result is significant in defining the orientation of the crystal for the most efficient non-linear performance (i.e. the phase matching direction is to be looked for in the plane perpendicular to the cleavage plane).

The method of the present invention provides a number of advantages. Single crystal films of m-NA with low concentrations of defects can be formed having a surface area of up to 1 cm$^2$ and thicknesses ranging from 0.5 to 500 microns. By forming crystals with a thickness of less than 3 microns, defects can be reduced, and in particular, the concentration of dislocations can be reduced. These single crystal films have a higher non-linear efficiency performance than that of polycrystalline films. In addition, the geometry of these single crystal films allows either diffraction and/or plane mode elements to be formed. The geometry of these films also allows the Cerenkov conditions for second harmonic generation to be achieved.

The use of the two plate structure including a recess and a groove, protects the single crystal film in the recess from mechanical and chemical damage. The crystal orientation of the film can be readily determined using interference techniques. Furthermore, the structure including the single crystal film in a recess between two plates combines the advantages of a crystalline structure, such as the phase matching condition which increases the efficiency of second harmonic generation, with that of optical waveguides. Accordingly, the number of modes generated can be limited for optical switching applications such as for optical computers and imaging.

Changes in temperature of films less than 3 microns thick can lead to deformation without destroying the film or causing defects. These deformations can change the refractive indices. In particular, lower electronic transitions, such as exciton bands, can be changed as a result of changing the temperature, thereby changing the optical properties of the crystal. This property effectively widens the optical applications of these crystalline films. The method of forming crystals of the present invention can further be used to screen organic compounds other than m-NA for non-linear optical applications.

Many modifications and other embodiments of the invention will come to one skilled in the art having the benefit of the teachings presented in the foregoing descriptions and the associated drawings. Therefore, it is to be understood that the invention is not to be limited to the specific embodiments disclosed, and that modifications are intended to be included within the scope of the appended claims.

That which is claimed:

1. An optical device comprising:
    a first plate having a first face, said first face defining a recess;
    a crystalline material in said recess; and
    a second plate having a second face, said second face covering said first face and said crystalline material in said recess.

2. An optical device according to claim 1 wherein said first face further defines a groove surrounding said recess.

3. An optical device according to claim 2 wherein a portion of said crystalline material is contained in said groove surrounding said recess.

4. An optical device according to claim 1 wherein said first and second plates comprise first and second transparent plates.

5. An optical device according to claim 4 wherein said first and second transparent plates comprise first and second fused quartz plates.

6. An optical device according to claim 1 wherein said face of said second plate is optically polished and wherein a surface of said recess opposite said second plate is optically polished.

7. An optical device according to claim 1 wherein said crystalline material comprises an organic compound.

8. An optical device according to claim 1 wherein said crystalline material comprises a single crystal film.

9. An optical device according to claim 1 wherein at least one of said plates is transparent, and further comprising a light source for illuminating said crystalline material.

10. An optical device according to claim 9 wherein comprising an optical detector for detecting illumination of said crystalline material.

11. A device for manufacturing crystal films, said device comprising:
    a first plate having a first face, said first face defining a recess,
    a second plate having a second face, and
    a crystallizable material in the recess,
    wherein the second face covers the first face and the crystallizable material in the recess, and wherein the crystallizable material is enclosed by the first and second faces.

12. The device of claim 11, wherein the first face further defines a groove surrounding the recess.

13. The device of claim 12, wherein at least a portion of the crystallizable material is contained in the groove.

14. The device of claim 11, wherein at least one of said first plate and said second plate is transparent.

15. The device of claim 14, wherein both said first plate and said second plate are transparent.

16. The device of claim 14, wherein at least one of said first plate and said second plate comprises quartz.

17. The device of claim 16, wherein both said first plate and said second plate comprise fused quartz.

18. The device of claim 11, wherein the second face and a surface of the recess opposite the second face are optically polished.

19. The device of claim 11, wherein the crystallizable material comprises an organic compound.

20. The device of claim 11, wherein the crystallizable material can form a single crystal film.

21. The device of claim 11, wherein the crystallizable material is protected by the first and second plates from damage.

22. The device of claim 21, wherein the damage is chemical damage, mechanical damage, or evaporation.

23. The device of claim 21, wherein the damage is due to radiation.

* * * * *